(12) United States Patent
Suto et al.

(10) Patent No.: US 12,092,675 B2
(45) Date of Patent: Sep. 17, 2024

(54) EVALUATION DEVICE OF RADIO COMMUNICATION MODULE

(71) Applicant: Fujikura Ltd., Tokyo (JP)

(72) Inventors: Yuki Suto, Sakura (JP); Eiji Takenaka, Sakura (JP); Katsumasa Takahashi, Sakura (JP); Go Katsura, Sakura (JP)

(73) Assignee: FUJIKURA LTD., Tokyo (JP)

( * ) Notice: Subject to any disclaimer, the term of this patent is extended or adjusted under 35 U.S.C. 154(b) by 134 days.

(21) Appl. No.: 18/088,901

(22) Filed: Dec. 27, 2022

(65) Prior Publication Data

US 2023/0228799 A1 Jul. 20, 2023

(30) Foreign Application Priority Data

Jan. 20, 2022 (JP) .................................. 2022-007165

(51) Int. Cl.
*G01R 29/08* (2006.01)
*G01R 29/10* (2006.01)

(52) U.S. Cl.
CPC ....... *G01R 29/0871* (2013.01); *G01R 29/105* (2013.01)

(58) Field of Classification Search
CPC .... G01R 29/0871; G01R 29/105; G01R 1/04; G01R 29/0821
See application file for complete search history.

(56) References Cited

U.S. PATENT DOCUMENTS

| | | | |
|---|---|---|---|
| 2002/0118136 A1* | 8/2002 | Gushiken | G06F 1/1656 343/702 |
| 2019/0212386 A1* | 7/2019 | Rowell | G01R 31/2874 |
| 2021/0190856 A1* | 6/2021 | Shiota | G01R 31/2875 |
| 2021/0194601 A1* | 6/2021 | Shiota | H04B 17/102 |
| 2022/0082613 A1* | 3/2022 | Kato | G01R 31/2868 |

FOREIGN PATENT DOCUMENTS

| | | |
|---|---|---|
| JP | 2003-008275 A | 1/2003 |
| JP | 2021-101163 A | 7/2021 |

* cited by examiner

*Primary Examiner* — Alvaro E Fortich
(74) *Attorney, Agent, or Firm* — WHDA, LLP

(57) ABSTRACT

An evaluation device includes a radio communication module that contains a temperature regulator that adjusts a temperature of a radio communication module to be evaluated, a housing case that houses the radio communication module and the temperature regulator, a gas supplier that supplies dry gas inside the housing case, and a measurement antenna that is disposed so as to face the radio communication module, and that transmits and receives radio waves for measurement. The housing case includes a case main body and a shutter plate that closes an opening of the case main body. The shutter plate is formed of a dielectric foam material, and the shutter plate is capable of contacting and separating from an open edge of the case main body. At least a part of the shutter plate separates from the open edge of the case main body to release gas from inside the housing case when an inner pressure of the housing case is greater than or equal to a predetermined value.

5 Claims, 6 Drawing Sheets

EVALUATION DEVICE OF RADIO COMMUNICATION MODULE

CROSS REFERENCE TO RELATED APPLICATION

Priority is claimed on Japanese Patent Application No. 2022-007165, filed Jan. 20, 2022, the contents of which are incorporated herein by reference.

TECHNICAL FIELD

The present invention relates to an evaluation device of a radio communication module.

BACKGROUND ART

For example, to evaluate a temperature property characteristic of a radio communication module, an evaluation device having a thermostatic chamber is used. The thermostatic chamber houses the radio communication module to be evaluated, and a measurement antenna. When evaluating the radio communication module using the evaluation device, inside the thermostatic chamber set at predetermined temperature conditions, communication is conducted between the radio communication module and the measurement antenna.

In this evaluation device, for example, after conducting low temperature testing, when returning the temperature inside the thermostatic chamber to a room temperature, condensation forms in the radio communication module, and due to condensation formation, the performance of the radio communication module may be affected. Because of this, as a counter measure for condensation, an evaluation device including a mechanism to circulate dry air inside the thermostatic chamber has been proposed (for example, refer to Japanese Unexamined Patent Application, First Publication No. 2003-8275).

SUMMARY OF INVENTION

However, in the evaluation device, dry air does not circulate well inside the thermostatic chamber, and there is a possibility that the suppression of condensation of the radio communication module is not enough.

An object of the present invention is to provide an evaluation device of a radio communication module capable of suppressing condensation of the radio communication module.

An embodiment of the present invention provides an evaluation device of a radio communication module, which includes a temperature regulator that adjusts a temperature of a radio communication module to be evaluated, a housing case that houses the radio communication module and the temperature regulator, a gas supplier that supplies dry gas inside the housing case, and a measurement antenna that is disposed so as to face the radio communication module, and that transmits and receives radio waves for measurement, wherein the housing case includes a case main body and a shutter plate that closes an opening of the case main body, the shutter plate is formed of a dielectric foam material, and is capable of contacting and separating from an open edge of the case main body, and at least a part of the shutter plate separates from the open edge of the case main body to release gas from inside the housing case when an inner pressure of the housing case is greater than or equal to a predetermined value.

According to this configuration, because the gas supplied inside the housing case is sequentially released as the inner pressure of the housing case rises, circulation of the dry gas inside the housing case is properly implemented, and inside the housing case, an atmosphere of the dry gas is maintained. Therefore, it is possible to suppress the condensation of the radio communication module.

Also, the gas supplier may include a supply source supplying the dry gas, and a tubular release part where one or a plurality of release holes releasing the dry gas are formed, and at least one of the release part may be disposed on an upper part of the housing case so as to face the release holes downwards, or on a lower part of the housing case so as to face the release holes upwards.

Also, the release holes may be formed so that the release holes are spaced apart from each other in a longitudinal direction of the release part.

Also, a plurality of the release parts may be provided, wherein the release parts include a first release part disposed on an upper part of the housing case, such that the release holes face downward, and a second release part disposed on a lower part of the housing case, such that the release holes face upward.

Also, the shutter plate may be formed of foam material, and a foaming ratio of the foam material is greater than or equal to 3 times.

According to the present invention, it is possible to provide an evaluation device of a radio communication module capable of suppressing condensation of the radio communication module.

DESCRIPTION OF EMBODIMENTS

Figure 1:
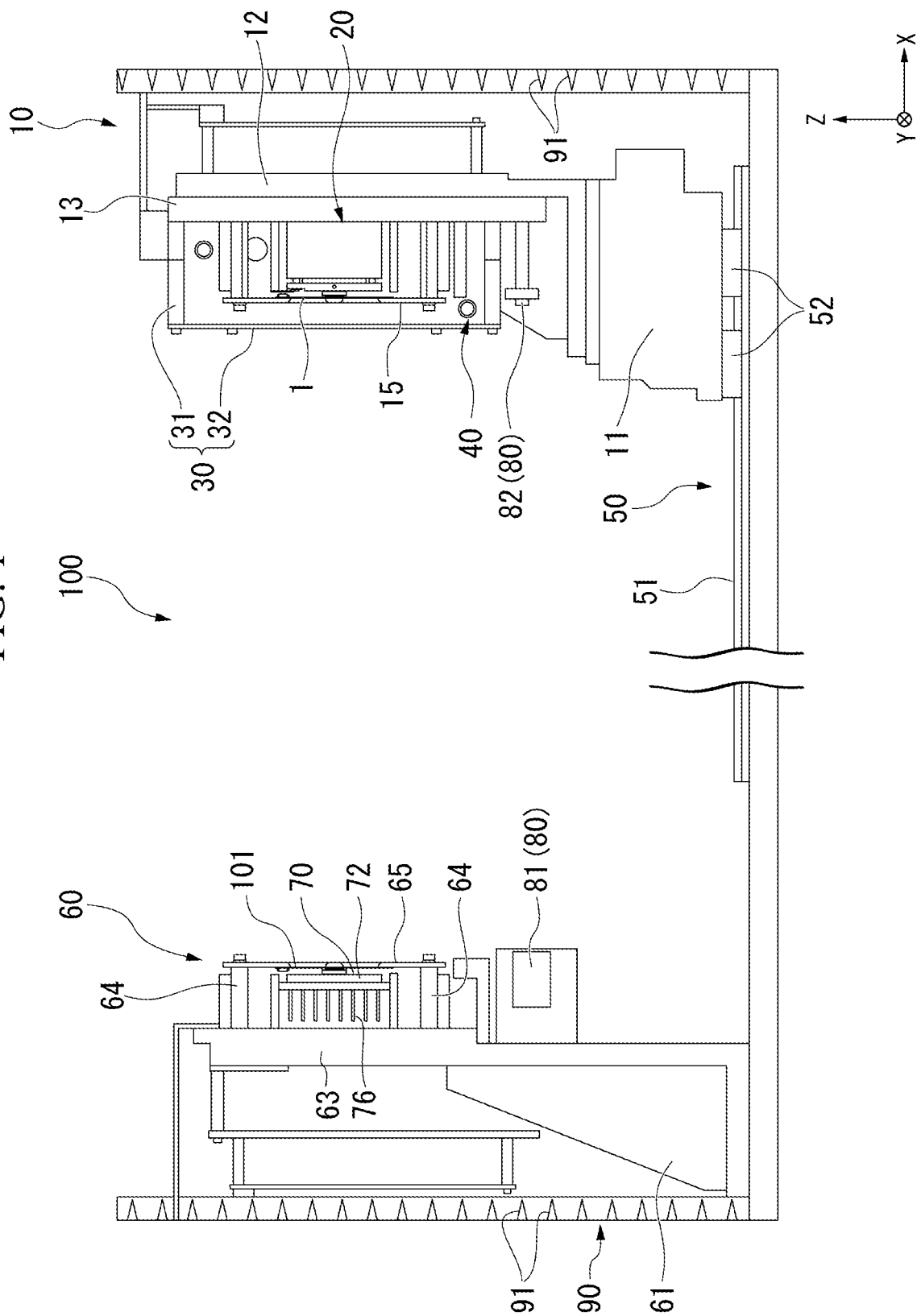
FIG. 1 is a diagram of an embodiment of an evaluation device of a radio communication module.
Figure 2:
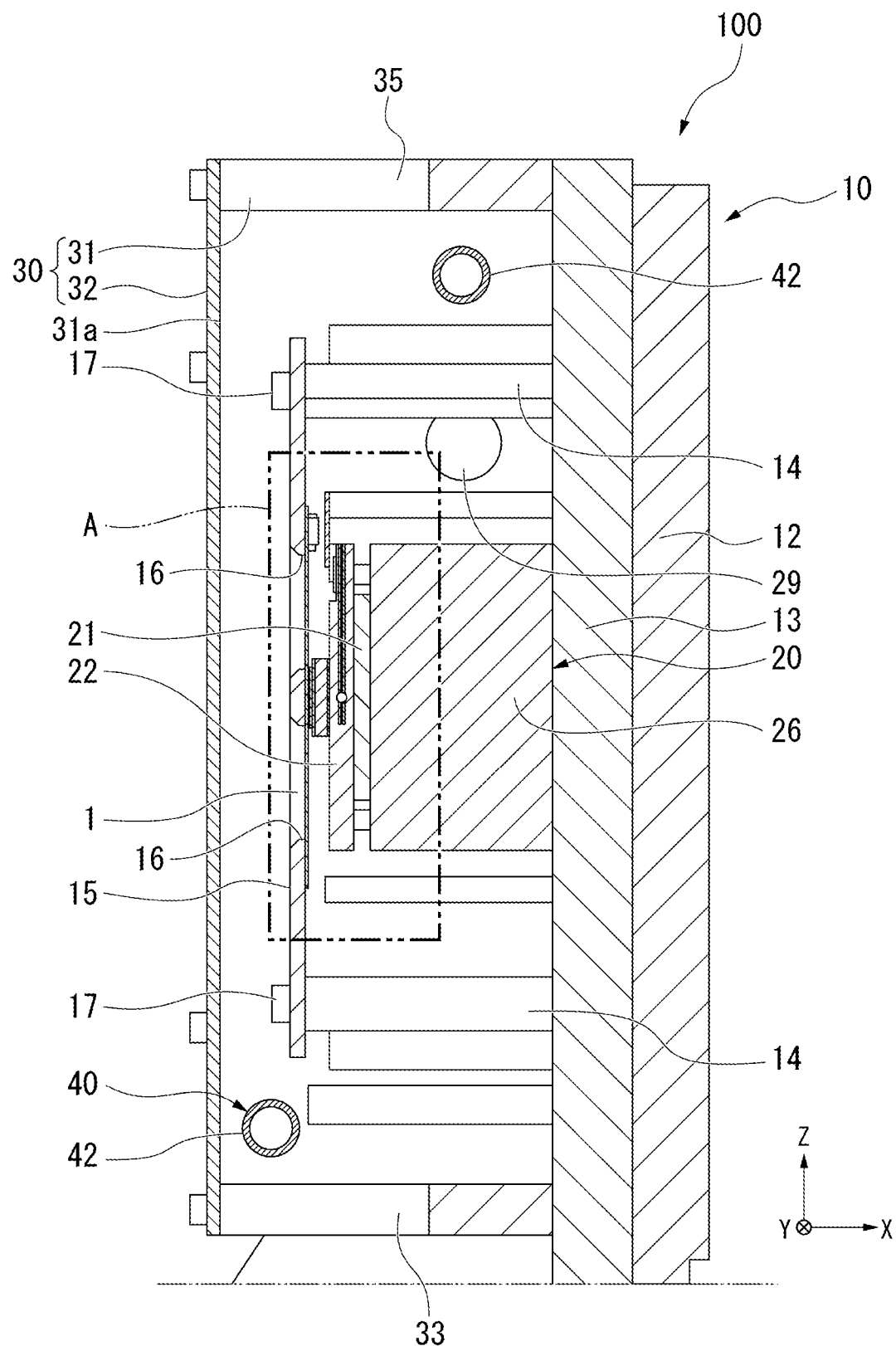
FIG. 2 is a diagram of a part of a specimen holding unit.
Figure 3:
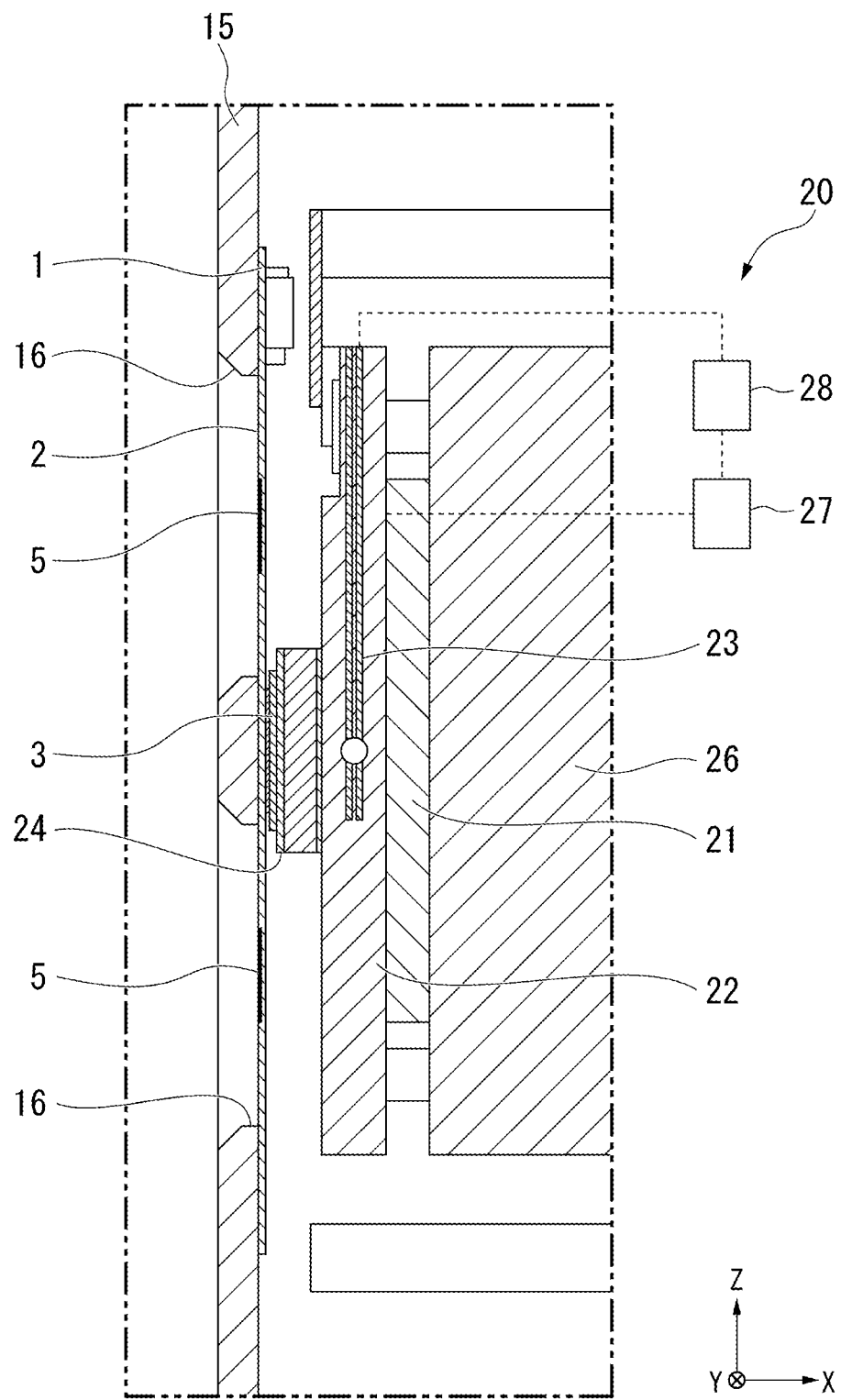
FIG. 3 is a diagram of a radio communication module and a first temperature adjusting mechanism.
Figure 4:
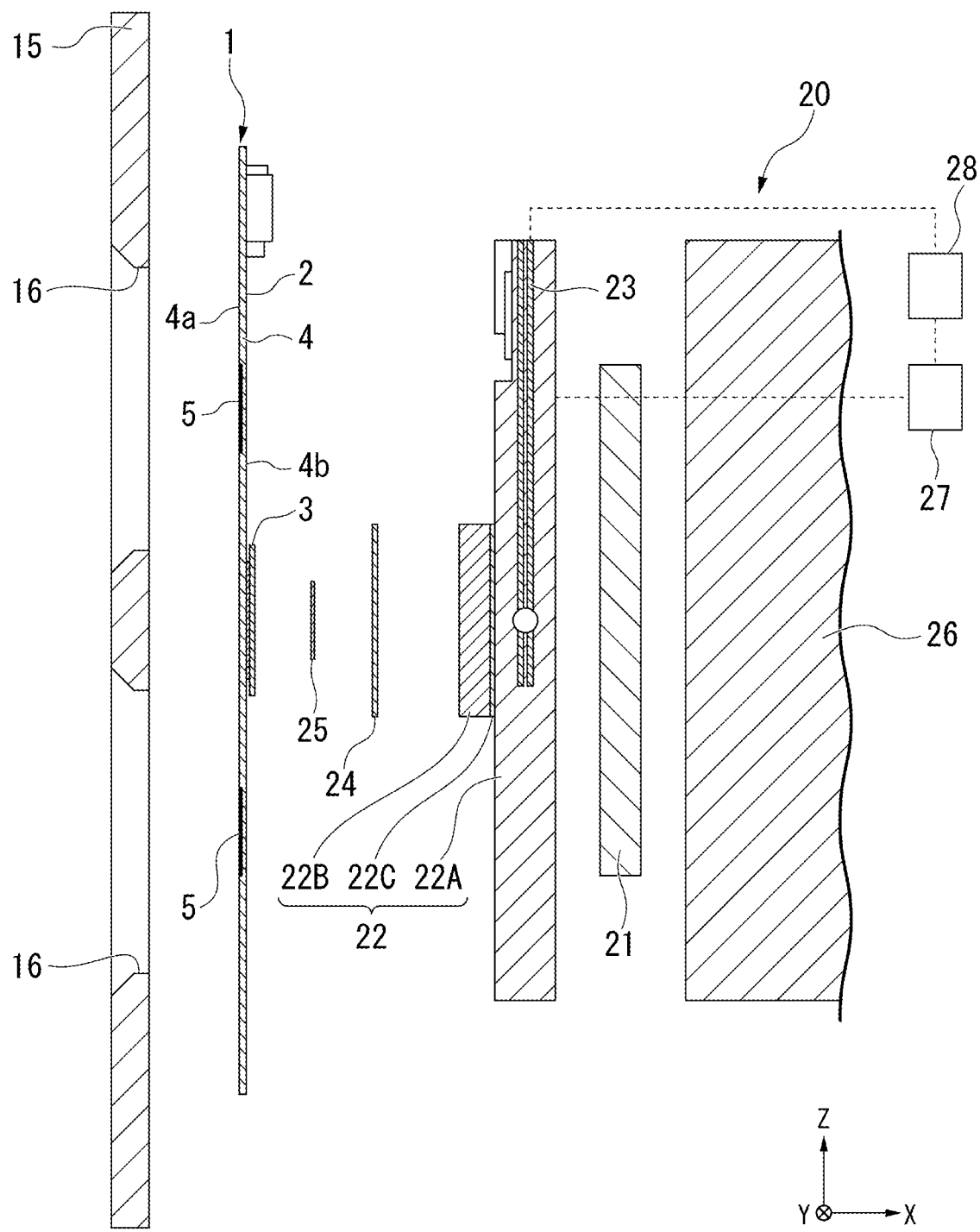
FIG. 4 is an exploded view of a radio communication module and a first temperature adjusting mechanism.
Figure 5:
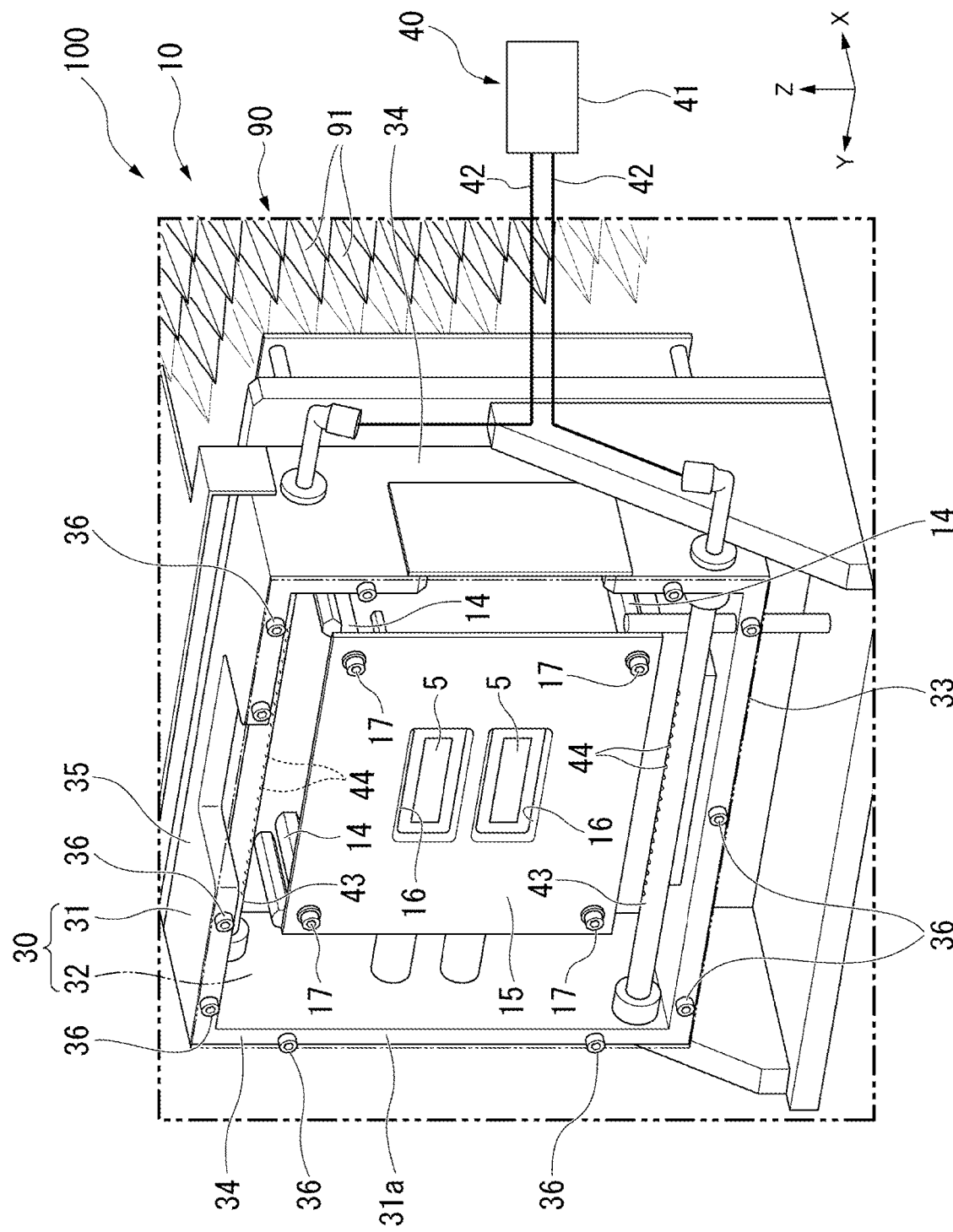
FIG. 5 is a perspective view of a part of a specimen holding unit.
Figure 6:
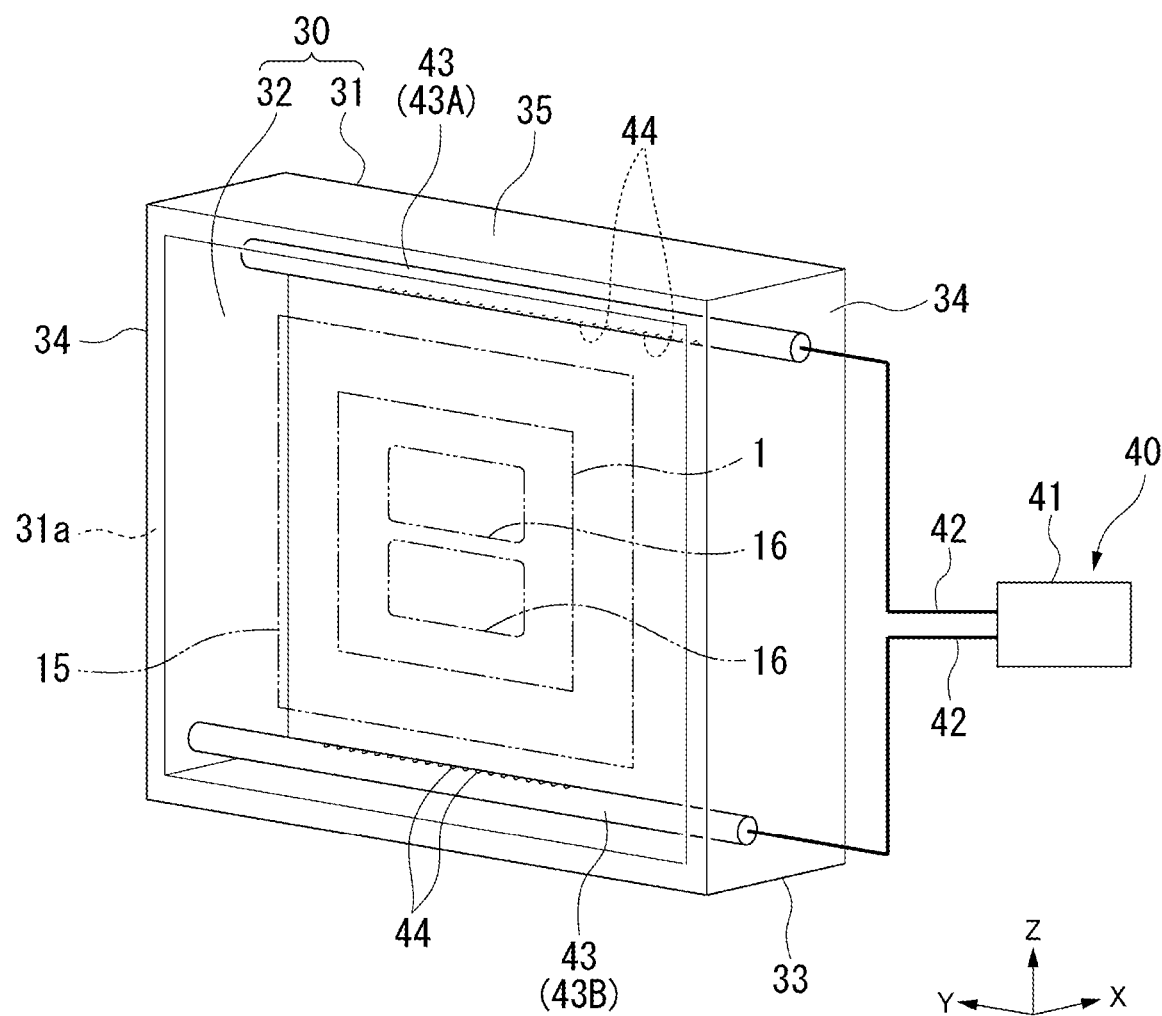
FIG. 6 is a schematic diagram of a gas supplier.

FIG. 1 is a diagram of an embodiment of an evaluation device 100 of a radio communication module. The evaluation device of a radio communication module may be referred to as an "evaluation device". FIG. 2 is a diagram of a portion of a specimen holding unit 10. FIG. 3 is a diagram of the radio communication module 1 and a first temperature adjusting mechanism 20. FIG. 3 is a partially enlarged view showing A on FIG. 2. FIG. 4 is an exploded diagram of the radio communication module 1 and the first temperature adjusting mechanism 20. FIG. 5 is a perspective view of a part of the specimen holding unit 10. FIG. 6 is a schematic diagram of a gas supplier 40.

Definition of Directions

An X direction, a Y direction, and a Z direction are defined as follows. The X direction is a direction where the specimen holding unit 10 and a measurement antenna unit 60 are arranged. The +X direction is a direction from the measurement antenna unit 60 towards the specimen holding unit 10. The Z direction is an up-down direction. The +Z direction is an upward direction. The Y direction is a direction orthogonal to the X direction and Z direction. As for the specimen holding unit 10, a direction that gets closer to the measurement antenna unit 60 is referred to as a "front" direction. As for the measurement antenna unit 60, a direction that gets closer to the specimen holding unit 10 is referred to as a "front" direction. Furthermore, positional relationships decided herein of the orientation of evaluation device 100 during usage are not limited to the orientation thereof.

Radio Communication Module

As shown on FIG. 1 and FIG. 2, the evaluation device 100, is a device to evaluate the radio communication module 1, which is the specimen. Before explaining the evaluation device 100, the radio communication module 1 is explained.

As shown on FIG. 4, the radio communication module 1 includes an antenna base plate 2 and an RFIC 3.

The antenna base plate 2 includes a rectangular plate substrate 4 and an antenna pattern 5 (refer to FIG. 5). The substrate 4, for example, is formed of a material having a small dielectric loss tangent (in other words, small losses at high frequency signals), and good transmission properties at high frequency signals. The antenna pattern 5 is formed on a first surface 4a (a surface in the −X direction), which is one side of a surface of the substrate 4, or on an inner part of the substrate 4.

The antenna pattern 5 is not particularly limited. For example, the antenna pattern 5 may be an array antenna or a phased array antenna which a plurality of radiating elements (not shown in figures) are formed in a two-dimensional shape on the first surface 4a. The antenna pattern 5 for example, may be any antenna, which may include a linearly shaped antenna, a flat surface antenna, a microstrip antenna, a patch antenna and so on.

The RFIC 3 includes a high frequency signal processing integrated circuit (RFIC: Radio Frequency Integrated Circuit) for millimeter wave bands and the like. An example of an IC package that is applicable to the RFIC 3, may be for example, a BGA (Ball Grid Alley), a CSP (Chip Size Package), or an FOWLP (Fan Out Wafer Level Package) and so on. The RFIC 3 is implemented on a second surface 4b (a surface in the +X direction), which is a surface on other side of the antenna base plate 2. The RFIC 3, for example, may be implemented by a connection part formed by soldering (SnAgCu or the like) on the second surface 4b of the antenna base plate 2.

The RFIC 3 for example, is made out to be a rectangular plate. A dimension in the Y direction of the RFIC 3 is less than a dimension in the Y direction of the antenna base plate 2. A dimension in the Z direction of the RFIC 3 is less than a dimension in the Z direction of the antenna base plate 2.

The radio communication module 1 for example, conducts high frequency signal transmission and reception of millimeter wave bands and the like. Although it is preferable that the radio communication module 1 be able to transmit and receive high frequency signals, the radio communication module may be a radio communication module that conducts transmission only, or reception only. For frequencies of high frequency signals, for example, 10 GHz to 300 GHz, or 60 GHz to 80 GHz and so on may be mentioned.

Evaluation Device of Radio Communication Module

As shown on FIG. 1, the evaluation device 100 includes the specimen holding unit 10, the first temperature adjusting mechanism 20, the housing case 30, the gas supplier 40, a motion mechanism 50, the measurement antenna unit 60, a second temperature adjusting mechanism 70, a position confirmation mechanism 80, and a chamber 90.

Specimen Holding Unit

The specimen holding unit 10 includes a base 11, a back plate 12, a support plate 13, a plurality of support columns 14 (refer to FIG. 2), and a holding plate 15.

The back plate 12 extends upwards from the upper part of base 11. The support plate 13 overlaps with the front surface (the surface in the −X direction) of the back plate 12. In the embodiment, the back plate 12 and the support plate 13 are disposed to be vertical in the X direction.

As shown on FIG. 2, the support column 14 extends to the front side (the −X direction) from the front surface (the surface in the −X direction) of the support plate 13. The support column 14 as seen from the front, is provided on each of the four ends of the holding plate 15 (refer to FIG. 5). A receiving hole is formed on a tip surface of the support column 14 (not shown in figure).

The holding plate 15 functions as a holder holding the radio communication module 1 to be evaluated. The holding plate 15, for example, is made of a non-metallic material (resin, glass or the like) that is minimally affected by the radio waves transmitted and received by the radio communication module 1. It is preferable that the holding plate 15 be made of a resin. The holding plate 15 may be formed from a fiber reinforced resin. The holding plate 15 may be made from a dielectric material.

When the holding plate 15 is formed of resin, it is possible to lessen the effects of radio wave transmission and reception for the radio communication module 1. Therefore, it is possible to accurately evaluate the properties of the radio communication module 1.

As shown on FIG. 5, the holding plate 15 for example, may be a rectangular plate. The holding plate 15 has a single or plurality of through openings 16 formed thereon. The through openings 16, from one side of the surface of the holding plate 15 to the other side of the surface, are formed so that the through openings 16 pass through the holding plate 15. In the embodiment, the through openings 16, as seen from a thickness direction of the holding plate 15, are rectangular. In the embodiment, the number of the through openings 16 is two. Both of the through openings 16 are formed with an interval in therebetween in the up down direction (Z direction). The through openings 16, as seen from a thickness direction of the holding plate 15, are large enough to include the antenna pattern 5 of the radio communication module 1.

The holding plate 15 is fixed on the tip surface of the support column 14 by a fixture 17. Insertion holes (not shown in figures) are formed on the four ends of the holding plate 15. The fixture 17 is inserted through the insertion holes on the holding plate 15, which is inserted into the receiving hole on the support column 14. The fixture 17 is fixed to the receiving hole using screws and the like. From this, the holding plate 15 holds down the radio communication module 1 toward a heat spreader 22 (refer to FIG. 3).

It is possible for the specimen holding unit 10 to pivot around a rotation axis along the Z direction. From this, the specimen holding unit 10 may be set to face the measurement antenna unit 60 in any direction. In the embodiment, the specimen holding unit 10 is set to face the measurement antenna unit 60 directly. But, because it is possible for the specimen holding unit 10 to pivot around the rotation axis, it is possible to change the direction that the specimen holding unit 10 faces in the left-right direction.

First Temperature Adjusting Mechanism

As shown on FIG. 3 and FIG. 4, the first temperature adjusting mechanism 20 adjusts the temperature of the radio communication module 1.

The first temperature adjusting mechanism 20 includes a temperature regulator 21, the heat spreader 22, a temperature adjusting sensor 23, a heat transfer sheet 24, a temperature monitoring sensor 25, a heat sink 26, a power source 27, a controller 28, and a dew point meter 29 (refer to FIG. 2).

The temperature regulator 21, for example, is a rectangular plate. The temperature regulator 21 overlaps the front surface (surface in the −X direction) of the heat sink 26. The temperature regulator 21, for example, is a Peltier element. When current in the first direction flows through the Peltier element due to electrification, the temperature of a surface of one side of the Peltier element increases, while the temperature of the surface on the other side decreases. When current in the second direction (opposing direction to that of the first direction) flows through the Peltier element, the temperature of a surface of one side of the Peltier element decreases, while the temperature of the surface on the other side increases. The temperature of the surface of one side of the Peltier element and temperature of the surface of the other side are determined by the magnitude of the current that flows through the Peltier element. In the case where the temperature regulator 21 is the Peltier element, by controlling the current that flows through the temperature regulator 21, it is possible to adjust the temperature of the radio communication module 1.

It is possible for the heat spreader 22 to disperse the heat from the temperature regulator 21. As shown on FIG. 4, the heat spreader 22 is a multilayered structure (double-layered to be precise) which includes a first part 22A and a second part 22B. The first part 22A and the second part 22B are formed of a material with a high thermal conductivity, for example, metals, such as copper or aluminum, carbon materials or the like.

The first part 22A for example, may be a rectangular plate. The first part 22A overlaps the front surface (surface in the −X direction) of the temperature regulator 21. The first part 22A, as seen from a thickness direction, is large enough to include the temperature regulator 21.

The first portion 22A faces the temperature regulator 21.

The second part 22B overlaps the front surface (surface in the −X direction) of the first part 22A. The second part 22B, for example, may be a rectangular plate. The second part 22B, as seen from a thickness direction, is large enough to include the RFIC 3 of the radio communication module 1. In the embodiment, the dimension in the Y direction of the second part 22B is greater than the dimension in the Y direction of the RFIC 3. The dimension in the Z direction of the second part 22B is greater than the dimension in the Z direction of the RFIC 3.

The second part 22B faces the radio communication module 1.

In the embodiment, the dimension in the Y direction of the second part 22B is less than the dimension in the Y direction of the first part 22A. The dimension in the Z direction of the second part 22B is less than the dimension in the Z direction of the first part 22A.

Between the rear surface of the second part 22B and the front surface of the first part 22A, a stress relief layer 22C is formed. The stress relief layer 22C, for example, may be made from a thermal grease. The thermal grease may be a fluid substrate which contains a plurality of conductive particles (metallic particles for example). The fluid substrate, for example, may be a silicone grease, a polyolefin grease or the like. The fluid substrate, for example, may be a fluid or a semi-solid. The conductive particles, for example, may be metallic particles, or ceramic particles or the like. The metallic particles for example, may be formed of metals with high thermal conductivity (copper, silver, aluminum and so on). The ceramic particles for example, may be formed of alumina, magnesium oxide, aluminum nitride or the like. The second part 22B is in surface contact with the front surface of the first part 22A through the stress relief layer 22C.

The heat spreader 22 is constructed such that the second part 22B is provided on the first part 22A through the stress relief layer 22C. The radio communication module 1 is pressed against the second part 22B. In the embodiment, the radio communication module 1 is pressed against the second part 22B through the heat transfer sheet 24 (to be mentioned later on) and the temperature monitoring sensor 25 (to be mentioned later on). The stress that forms due to the second part 22B being pressed by the radio communication module 1 is mitigated by the stress relief layer 22C. Because of this, it is possible to suppress the pressing force applied to the temperature regulator 21. Therefore, it is possible to avoid damaging of the temperature regulator 21.

The temperature adjusting sensor 23 detects the temperature of the heat spreader 22. The temperature adjusting sensor 23, for example, may be built-into the first part 22A of the heat spreader 22. The temperature adjusting sensor 23, for example, may include a thermocouple, a thermistor, a resistance thermometer bulb or the like.

The heat transfer sheet 24 is provided between the front surface of the second part 22B and the rear surface of the RFIC 3 of the radio communication module 1. The heat transfer sheet 24 contacts the front surface of the second part 22B and the rear surface of the RFIC 3. In the embodiment, a portion of the front surface of the heat transfer sheet 24 contacts the rear surface of the RFIC 3 through the temperature monitoring sensor 25. It is possible for the heat transfer sheet 24 to transfer heat from the second part 22B to the RFIC 3.

The heat transfer sheet 24, for example, may be a rectangular plate. The heat transfer sheet 24, for example, may include a thermally conductive material, and a resin, wherein the thermally conductive material is made of a carbon material, a metal, an inorganic compound or the like. As a carbon material for example, graphite, graphene, carbon fiber, carbon black or the like may be mentioned. As a metal for example, copper, silver, aluminum or the like may be mentioned. As an inorganic compound for example, aluminum oxide, magnesium oxide or the like may be mentioned.

The heat transfer sheet 24, may be an elastic body deformable in a thickness direction when compressed. From this, it is possible to decrease the gap between the second part 22B and the RFIC 3, while increasing the heat transfer efficiency between the second part 22B and the RFIC 3. The heat transfer sheet 24 exhibits flexible properties. The heat transfer sheet may be referred to as a heat dissipation sheet, or a thermal conductivity sheet.

The heat transfer sheet 24, as seen from a thickness direction, is large enough to include the RFIC 3 of the radio communication module 1. The heat transfer sheet 24 is large enough to include the front surface of the second part 22B. In the embodiment, the heat transfer sheet 24 is the same shape as that of the front surface of the second part 22B. The heat transfer sheet 24 is disposed on the front surface of the second part 22B. The heat transfer sheet 24 covers the front surface of the second part 22B over the entire region of the front surface of the second part 22B.

Both surfaces of the heat transfer sheet 24 are non-adherent. For this reason, the heat transfer sheet 24 does not adhere to the radio communication module 1. Therefore, it is possible to conduct the operation of mounting and dismounting of the radio communication module 1 easily.

The temperature monitoring sensor 25 may be a sheet like shape. The temperature monitoring sensor 25 detects the temperature of the RFIC 3. The temperature monitoring sensor 25, for example, may be a thermocouple. The temperature monitoring sensor 25, is provided in between the heat transfer sheet 24 and the RFIC 3. The temperature monitoring sensor 25, as seen from a thickness direction, is smaller than the RFIC 3. By measuring the temperature of the RFIC 3 on the temperature monitoring sensor 25, it is possible to accurately comprehend the temperature of the RFIC 3. The temperature monitoring sensor 25 is less in thickness than the heat transfer sheet 24. The thickness of the temperature monitoring sensor 25, for example, may be less than or equal to one tenth the thickness of the heat transfer sheet 24.

The heat sink 26 is provided on the rear surface side of the temperature regulator 21. The heat sink 26, for example, may be a water-cooled, or an air-cooled heat sink or the like. It is desirable for the heat sink 26 to be a water-cooled heat sink. The heat sink 26 is placed on the front surface of the support plate 13 (refer to FIG. 2).

It is possible for the heat sink 26 to increase or decrease the temperatures of the temperature regulator 21 and the radio communication module 1 in a short period of time.

The power source 27 supplies power to the temperature regulator 21.

The controller 28, based off of the detected value by the temperature adjusting sensor 23, by controlling the current that flows from the power source 27 to the temperature regulator 21, the temperature of the temperature regulator 21 is adjusted.

The dew point meter 29 measures the dew point inside the housing case 30 (refer to FIG. 2).

Housing Case

As shown on FIG. 2 and FIG. 5, the housing case 30 houses the radio communication module 1 to be evaluated and the temperature regulator 21. The housing case 30 includes a case main body 31, and a shutter plate 32.

The case main body 31 extends to the front side from the front surface of the support plate 13. The case main body 31 includes a bottom plate 33, a pair of side plates 34, and a top plate 35. The bottom plate 33, for example, is a rectangular plate along the XY plane. The pair of the side plates 34 are erected on the ends in the Y direction of the bottom plate 33. The side plates 34, for example, may be a rectangular plate along the XZ plane. The top plate 35 is formed from the top end of one of the side plates 34 to the top end of the other of the side plates 34. The top plate 35, for example, may be a rectangular plate along the XY plane. The case main body 31 is formed so as to be a rectangular frame. The case main body 31 includes an open end 31a on the front surface.

The shutter plate 32 is a rectangular plate along the YZ plane. The shutter plate 32 functions as a lid element that covers the front surface opening of the case main body 31. The shutter plate 32, as seen from a thickness direction, is large enough to include the front surface opening of the case main body 31.

The shutter plate 32 is formed of a dielectric foam. As the dielectric foam, foamy resin such as polyolefin foam (for example, polyethylene foam or the like) and the like may be mentioned. Since the shutter plate 32 is a foam, flexibility of the shutter plate 32 may be increased, and when the inner pressure of the housing case 30 is greater than or equal to a predetermined value, the shutter plate 32 may elastically deform easily in the thickness direction. The predetermined value, for example, may be the value of atmospheric pressure. For this reason, according to the inner pressure of the housing case 30, the contacting and separating movement of the shutter plate 32 against the open end 31a of the case main body 31 becomes easier.

The shutter plate 32, because it is a foam, when compared to a non-foam, the apparent permittivity is close to that of air. For this reason, it prevents multipath reflection to occur inside the shutter plate 32. Therefore, inside the shutter plate 32, it is possible to suppress the effects of multipath. The shutter plate 32, because it is a foam, exhibits high thermal insulation effects, which makes the temperature adjustment of the radio communication module 1 easier.

It is preferable for the foam that the shutter plate 32 is made to have a foaming ratio greater than or equal to 3 times. When the foaming ratio of the foam is greater than or equal to 3 times, it is possible to decrease the transmission losses of the radio waves on the shutter plate 32.

When the shutter plate 32 formed of a polypropylene foam (thickness 5 mm, relative permittivity 1.3) with a foaming ratio of 3 times was used to run a simulation of the transmission loss, the largest value of transmission loss in the frequency range of 57 GHz to 71 GHz of the radio waves was about 0.1 dB. With the exception of using the shutter plate 32 formed of a polypropylene foam (relative permittivity 1.5), and a foaming ratio of 2 times, when the same simulation is run with the same conditions as the above-mentioned, the largest value of the transmission loss came out to be about 0.2 dB. With the exception of using the shutter plate 32 formed of a polypropylene foam (relative permittivity 1.2), and a foaming ratio of 5 times, when the same simulation is run with the same conditions as the above-mentioned, the largest value of the transmission loss came out to be about 0.04 dB. As a result of constructing the shutter plate 32 of a foam with a foaming ratio greater than or equal to 3 times, it is possible to obtain results where the transmission loss is decreased (for example, less than or equal to 0.1 dB). Furthermore, the frequencies 57 GHz to 71 GHz are example of the applicable frequency range of the radio communication module, which uses the 60 GHz band.

It is possible to set the foaming ratio of the foam so that it is less than or equal to 50 times. From this, the mechanical strength of the shutter plate 32 is insured.

As shown on FIG. 5, a circumferential part of the shutter plate 32 is fixed by a plurality of fixtures 36 to the open end 31a of the case main body 31. The plurality of fixtures 36 are provided on the circumferential part of the shutter plate 32 at set intervals.

It is possible for the shutter plate 32 to contact and separate from the open end 31a of the case main body 31 according to the gas pressure inside the housing case 30.

For example, the shutter plate 32 is in contact with the open end 31a of the case main body 31 over the entire circumference when the gas pressure of the housing case 30 is below a predetermined value. From this, the shutter plate 32 seals off the opening on the front surface of the case main body 31, so that the inside of the housing case 30 becomes a closed space.

When the inner pressure of the housing case 30 is greater than or equal to a predetermined value, at least a part of the shutter plate 32 separates from the open end 31a of the case main body 31. For example, the circumferential portion of the shutter plate 32 separates from the open end 31a of the case main body 31 between the adjacent fixtures 36. From this, it is possible to release (discharge) the gas from inside the housing case 30 to the outside, from the gap between the shutter plate 32 and the open end 31a of the case main body 31. Because of this, it is possible for the housing case 30 to discharge gas by having at least a part of the shutter plate 32 separate from the open end 31a.

Gas Supplier

As shown on FIG. 5 and FIG. 6, the gas supplier 40 includes a supply source 41 supplying the dry gas, a plurality of intake passages 42, and a plurality of release parts 43.

In the supply source 41, for example, dry gas is obtained by removing moisture from the gas using a membrane filter. The supply source 41 may also be a configuration where dry gas is obtained from a dehumidifying element such as silica gel or the like that removes moisture from the gas. The supply source 41 may also be a configuration where dry gas is obtained by cooling the gas to remove the moisture. As for the gas, there are particularly no limitations, and gases such as air or nitrogen or the like may be mentioned.

The intake passages 42 guide the dried gas supplied from the supply source 41 to the release part 43.

The release part 43 is formed to be tubular (cylindrical to be precise). A plurality of release holes 44 are formed in the release part 43. The release holes 44, for example, are formed from the inner circumferential surface of the release part 43 up to the outer circumferential surface so as to penetrate through the release part 43. The release holes 44 for example, are cylindrical through holes. It is possible for the release holes 44 to release the dry gas inside the release part 43 to the outside of the release part 43, supplying the inside of the housing case 30. The plurality of the release holes 44 are formed so as to align in the length direction of the release part 43. The plurality of the release holes 44 are formed at set intervals in the length direction of the release part 43.

In the embodiment, the quantity of the release parts 43 is two. Each of the two release parts 43 is housed inside the housing case 30.

One of the two release parts 43 is referred to as a first release part 43A (refer to FIG. 6). The first release part 43A extends along the Y direction, and is housed on the upper part of the space inside the housing case 30. Because the release holes 44 are formed on the bottom part of the first release part 43A, dry gas is released toward the bottom direction.

The other of the two release parts 43 is referred to as a second release part 43B (refer to FIG. 6). The second release part 43B extends along the Y direction, and is housed on the bottom part of the space inside the housing case 30. Because the release holes 44 are formed on the upper part of the second release part 43B, dry gas is released toward the upper direction.

Motion Mechanism

As shown on FIG. 1, the motion mechanism 50 includes a slide rail 51 and a slider 52.

The slide rail 51 is provided on the base surface of the chamber 90. The slide rail 51 is a straight rail that extends along the X direction.

The slider 52 is provided on the bottom part of the specimen holding unit 10. The slider 52 is movable along the slide rail 51. The specimen holding unit 10 is movable along the slide rail 51 in the X direction due to the slider 52. Because of this, the separation distance from the measurement antenna unit 60 to the specimen holding unit 10 can be determined freely.

Measurement Antenna Unit

The measurement antenna unit 60 includes a base 61, a support plate 63, a plurality of support columns 64, a holding plate 65, and a measurement antenna module 101 (measurement antenna).

The support plate 63 extends in the upper direction from the base 61. The support columns 64 extend in the front direction (+X direction) from the front surface of the support plate 63. The holding plate 65 functions as a holder to hold the measurement antenna module 101. The holding plate 65 is made from a material having little effect on the radio waves transmitted and received by the measurement antenna module 101, with low thermal conductivity, for example, a resin such as PEEK (Polyether Ether Ketone) or the like. The holding plate 65 holds down the measurement antenna module 101 toward a heat spreader 72.

The measurement antenna module 101, as with the radio communication module 1 (refer to FIG. 4), includes an antenna base plate, and an RFIC. The measurement antenna module 101 transmits and receives measurement radio waves. The measurement antenna module 101, for example, transmits and receives high frequency signals of millimeter wave bands and so on. For frequencies of high frequency signals, for example, 10 GHz to 300 GHz, or 60 GHz to 80 GHz and so on may be mentioned. The measurement antenna module 101 is installed so as to oppose the radio communication module 1.

In the embodiment, the measurement antenna unit 60 which includes the measurement antenna module 101 is used. However, the measurement antenna unit is not limited to the example shown on FIG. 1. As an example of a measurement antenna unit, a measurement antenna unit using a horn antenna may be used.

Second Temperature Adjusting Mechanism

The second temperature adjusting mechanism 70 includes the heat spreader 72, and a heat sink 76. The heat spreader 72 may be the same construction as the heat spreader 22 of the specimen holding unit 10. The heat spreader 72, for example, contacts to the RFIC of the measurement antenna module 101 through the heat transfer sheet. The heat sink 76, for example, is an air-cooled heat sink.

Position Confirmation Mechanism 80

The position confirmation mechanism 80 includes a light source 81, which is a laser light source or the like, and a light receiving part 82. The light receiving part 82 receives light from the light source 81. The light source 81 is provided on the front surface of the base 61 of the measurement antenna unit 60. The light receiving part 82 is provided on the front surface of the support plate 13 of the specimen holding unit 10.

According to the position confirmation mechanism 80, it is possible to confirm that the orientation of the specimen holding unit 10 such that the specimen holding unit 10 faces the measurement antenna unit 60 directly, due to light from the light source 81 being received by the receiving part 82.

Chamber 90

The chamber 90 houses the specimen holding unit 10, the first temperature adjusting mechanism 20, the housing case 30, the gas supplier 40, the motion mechanism 50, the measurement antenna unit 60, the second temperature adjusting mechanism 70 and the position confirmation mechanism 80. The chamber 90 is not affected by electromagnetic waves from its surroundings, and it is possible for the chamber 90 to suppress electromagnetic waves from escaping to its surroundings. It is possible for the chamber 90 to suppress electromagnetic waves from echoing on the inside of the chamber 90.

A radio wave absorber 91 is provided on an inner surface of the chamber 90. The radio wave absorber 91, for example, is a dielectric radio wave absorber. The dielectric radio wave absorber absorbs radio waves due to dielectric losses. The radio wave absorber 91, for example, is made of resin foam (urethane foam or the like) that includes carbon powder. The radio wave absorber 91, is not limited to a dielectric radio wave absorber, and may be a conductive radio wave absorber, a magnetic radio wave absorber or the like.

Radio Communication Module Evaluation Method

By using the evaluation device 100 shown on FIG. 1, an evaluation method of the radio communication module 1 is explained.

In this example, an evaluation test of the temperature properties of the radio communication module 1 is conducted by confirming the transmission and reception conditions of radio waves between the radio communication module 1 and the measurement antenna module 101.

As shown on FIG. 5 and FIG. 6, dry gas is obtained from the supply source 41 of the gas supplier 40.

According to the temperature of the evaluation test, the dry gas is adjusted so that conditions of no condensation formation (or conditions of a small amount of condensation) inside the housing case 30 are satisfied. For example, the humidity level of the dry gas is selected so as not to form condensation in a lower limit value of the temperature range of the evaluation test. For example, when the lower limit value of the temperature range of the evaluation test is −40 degrees Celsius, the humidity level of the dry gas is set so no condensation forms at −40 degrees Celsius.

As shown on FIG. 6, dry gas supplied from the supply source 41 is guided into the release parts 43 through the intake passages 42. Dry gas in the release parts 43 is released through the release holes 44, and is supplied to the inside of the housing case 30. Out of the two release parts 43, dry gas released from the first release part 43A is released downwards. Dry gas released from the second release part 43B is released upwards.

When the inner pressure of the housing case 30 is greater than or equal to a predetermined value, at least a part of the shutter plate 32 separates from the open end 31a of the case main body 31. It is possible to release (discharge) the gas from inside the housing case 30 to the outside, from the gap between the shutter plate 32 and the open end 31a of the case main body 31.

As shown on FIG. 3 and FIG. 4, the temperature of the radio communication module 1 is set by the temperature regulator 21. Based on the detected value of the temperature adjusting sensor 23, by controlling the current that flows from the power source 27 to the temperature regulator 21, it is possible for the controller 28 to adjust the temperature of the temperature regulator 21. It is possible for the controller 28, for example, to raise the temperature of the temperature regulator 21 by increasing the current that flows to the temperature regulator 21 when the detected value is less than a lower limit value of a predetermined set range. It is possible for the controller 28, for example to lower the temperature of the temperature regulator 21 by decreasing the current that flows to the temperature regulator 21 when the detected value is greater than an upper limit value of a predetermined set range. From this, the radio communication module 1 is set to a target temperature.

As shown on FIG. 1, while supplying dry gas to the housing case 30, and setting the temperature of the radio communication module 1, the conditions of transmission and reception of radio waves between the radio communication module 1 and the measurement antenna module 101 are confirmed.

In particular, for example, if radio waves transmitted from the radio communication module 1 are made to be received by the measurement antenna module 101, it is possible to evaluate whether the radio communication module 1 is appropriately transmitting or not. If radio waves transmitted from the measurement antenna module 101 are made to be received by the radio communication module 1, it is possible to evaluate whether the radio communication module 1 is appropriately receiving or not.

While appropriately adjusting the temperature of the radio communication module 1, by confirming the conditions of transmission and reception, it is possible to evaluate the temperature properties of the radio communication module 1.

Effects of which the Evaluation Device of a Radio Communication Module in the Embodiments Achieves In the evaluation device 100, instead of supplying gas to the entirety of the chamber 90, the gas supplier 40 supplies dry gas inside the housing case 30 by having dry gas spread to the entire inner space of the housing case 30, therefore suppressing condensation of the radio communication module 1.

In the evaluation device 100, because the supplied gas inside the housing case 30 is sequentially discharged as the inner pressure of the housing case 30 rises, circulation of dry gas inside the housing case 30 is appropriately conducted, and an atmosphere of dry gas is preserved inside the housing case 30. Therefore, it is possible to suppress malfunctions of the radio communication module 1 due to condensation, and it is possible to evaluate the temperature properties of the radio communication module 1 appropriately.

Because the gas supplier 40 supplies dry gas downward from the first release parts 43A installed on the upper part of the housing case 30, it is possible for dry gas to spread inside the housing case 30. Because the gas supplier 40 supplies dry gas upward from the second release parts 43B installed on the bottom part of the housing case 30, it is possible for dry gas to spread inside the housing case 30. Therefore, it is possible to suppress condensation inside the radio communication module 1. Because the embodiment includes the first release parts 43A and the second release parts 43B, it is possible to spread dry gas more effectively inside the housing case 30.

Because the release holes 44 of the release parts 43 are formed in the length direction of the release holes 44 at set intervals, inside the housing case 30, it is possible to supply dry gas over a wide range in the Y direction. Therefore, it is possible to spread dry gas inside the housing case 30.

Furthermore, the technical scope of the present invention is not limited to any of the previously mentioned embodiments, and it is possible to add variations so long as they do not depart from the objective of the present invention.

Although the heat spreader 22 shown on FIG. 3, which includes the first part 22A and the second part 22B, has a double-layered structure, it may be a structure greater than or equal to a triple-layered structure. The heat spreader may also be a single-layered structure.

As the temperature regulator 21 shown on FIG. 3 and FIG. 4, a Peltier element was used as an example. However, the temperature regulator is not limited thereto. The temperature regulator may be a heater of a heating wire or the like of a nichrome wire or the like. The temperature regulator may include a cooling mechanism such as a chiller (a device that circulates cool water) or the like.

Although the quantity of the release parts 43 on the gas supplier 40 shown on FIG. 5 are two, the quantity of the release parts may be 1 or more (arbitrary number equal to or more than 2).

Also, because the case main body 31, as seen from the front, forms a rectangular frame, the open end 31a is formed in a rectangular shape, as well. However, the shapes of the case main body 31 and the open end 31a are not limited thereto. For example, the case main body 31 and the open end 31a may be substantially circular as seen from the front. Also, similarly the shutter plate 32 is not limited to being rectangular in shape, as seen from the thickness direction, and may be any shape that includes the front surface opening of the case main body 31.

Although embodiments of the present invention have been described above in detail with reference to the drawings, specific configurations are not limited to the embodiments and other designs and the like may also be included without departing from the objective and scope of the present invention.

What is claimed is that:

1. An evaluation device of a radio communication module, comprising:
    a temperature regulator that adjusts a temperature of the radio communication module to be evaluated;
    a housing case that houses the radio communication module and the temperature regulator;
    a gas supplier that supplies dry gas inside the housing case; and
    a measurement antenna that is disposed so as to face the radio communication module, and that transmits and receives radio waves for measurement, wherein
    the housing case includes a case main body and a shutter plate that closes an opening of the case main body,
    the shutter plate is formed of a dielectric foam material, and is capable of contacting and separating from an open edge of the case main body, and
    at least a part of the shutter plate separates from the open edge of the case main body to release gas from inside the housing case when an inner pressure of the housing case is greater than or equal to a predetermined value.

2. An evaluation device of a radio communication module according to claim 1, wherein
    the gas supplier includes:
        a supply source supplying the dry gas; and
        a tubular release part where one or a plurality of release holes releasing the dry gas are formed, and
    at least one release part is disposed on an upper part of the housing case so as to face the release holes downwards, or on a lower part of the housing case so as to face the release holes upwards.

3. An evaluation device of a radio communication module according to claim 2, wherein
    the release holes are formed so that the release holes are spaced apart from one another in a longitudinal direction of the release part.

4. An evaluation device of a radio communication module according to claim 2, wherein
    the release part is included in a plurality of release parts, and
    the release parts include:
        a first release part that is disposed, on an upper part of the housing case, such that the release holes face downward, and
        a second release part that is disposed, on a lower part of the housing case, such that the release holes face upward.

5. An evaluation device of a radio communication module according to claim 1, wherein
    the shutter plate is formed of a foam material, and a foaming ratio of the foam material is greater than or equal to 3 times.

* * * * *